(12) United States Patent
Stonick et al.

(10) Patent No.: US 11,784,783 B2
(45) Date of Patent: Oct. 10, 2023

(54) WAVEFORM CONSTRUCTION USING INTERPOLATION OF DATA POINTS

(71) Applicant: Synopsys, Inc., Mountain View, CA (US)

(72) Inventors: John Stonick, Mountain View, CA (US); Michael W. Lynch, Mountain View, CA (US); Dino Toffolon, Mountain View, CA (US); Ayal Shoval, Mountain View, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/619,213

(22) PCT Filed: Jun. 26, 2020

(86) PCT No.: PCT/US2020/039867
§ 371 (c)(1),
(2) Date: Dec. 14, 2021

(87) PCT Pub. No.: WO2020/264330
PCT Pub. Date: Dec. 30, 2020

(65) Prior Publication Data
US 2022/0247546 A1 Aug. 4, 2022

Related U.S. Application Data

(60) Provisional application No. 62/867,462, filed on Jun. 27, 2019.

(51) Int. Cl.
*H03D 1/04* (2006.01)
*H03D 1/06* (2006.01)
(Continued)

(52) U.S. Cl.
CPC ................... *H04L 7/0029* (2013.01)

(58) Field of Classification Search
CPC ......... H04L 7/0029; H04L 1/205; G10H 7/08; H03M 1/1245; H01L 27/0605
(Continued)

(56) References Cited

U.S. PATENT DOCUMENTS 6,124,542 A * 9/2000 Wang ................. G10H 7/08
84/603
6,469,649 B1 * 10/2002 Helkey ............... H03M 1/1245
341/143
(Continued)

OTHER PUBLICATIONS

Danesfahani, R. et al., "Symbol Timing Synchronization of π / 4—DQPSK Signals Using Polyphase Filterbanks", EUROCON 2007 the International Conference on "Computer as a Tool", IEEE, PI, Sep. 9, 2007, pp. 882-887.
(Continued)

*Primary Examiner* — Phuong Phu
(74) *Attorney, Agent, or Firm* — Weaver Austin Villeneuve & Sampson LLP

(57) ABSTRACT

A method of constructing a waveform from N sampled data captured at N successive points in time, includes, in part, applying the N sampled data, K data at a time, to each of M delayed replicas of a filter that includes K taps so to generate N×M interpolated data. The waveform is then constructed from the N sampled data and the N×M interpolated data.

20 Claims, 16 Drawing Sheets

(51) Int. Cl.
　　　*H03K 5/01*　　　(2006.01)
　　　*H03K 6/04*　　　(2006.01)
　　　*H04B 1/10*　　　(2006.01)
　　　*H04L 1/00*　　　(2006.01)
　　　*H04L 25/08*　　(2006.01)
　　　*H04L 7/00*　　　(2006.01)

(58) Field of Classification Search
　　　USPC .................. 375/346, 316, 350, 231, 229
　　　See application file for complete search history.

(56) References Cited

U.S. PATENT DOCUMENTS

| | | | |
|---|---|---|---|
| 8,467,436 B1 * | 6/2013 | Warner | H04L 1/205 375/219 |
| 8,855,179 B1 | 10/2014 | Saed | |
| 2002/0181612 A1 * | 12/2002 | Warble | H01L 27/0605 257/E21.12 |

OTHER PUBLICATIONS

Gardner, F.M. et al., "Interpolation in Digital Modems—Part 1: Fundamentals", IEEE Transactions on Communications, Mar. 1993, vol. 41, No. 3, pp. 501-507.
Harris, F.J. et al., "Multirate Digital Filters for Symbol Timing Synchronization in Software Defined Radios", IEEE Journal on Selected Areas in Communications, Dec. 2001, vol. 19, No. 12, pp. 2346-2357.
International Preliminary Report on Patentability dated Jan. 6, 2022 in PCT Application No. PCT/US2020/039867.
International Search Report and Written Opinion dated Oct. 1, 2020 in PCT Application US2020/039867.

* cited by examiner

WAVEFORM CONSTRUCTION USING INTERPOLATION OF DATA POINTS

CROSS REFERENCE TO RELATED APPLICATIONS

The present application claims priority to U.S. Application No. 62/867,462, filed Jun. 27, 2019, the content of which is incorporated herein by reference in its entirety.

TECHNICAL FIELD

The present disclosure generally relates to a communication system, and more particularly, to a system and method for constructing a waveform using interpolated data.

BACKGROUND

One technique for generating an eye diagram for binary signaling in a Serializer/Deserializer (SERDES) involves shifting the timing of the main data slicer to supply the data required to form the eye diagram. An eye diagram formed using an analog-to-digital converter (ADC)-based receiver is destructive in nature as it requires the timing on the main data path to be shifted and sampled to generate the required statistics. When scanning the edges of the eye patterns in the eye diagram, the time shift causes the data samples to be error-prone thereby leading to non-usable data samples for the main data path. Normal link operation is halted during this process.

In accordance with another technique, additional circuitry, such as an auxiliary slicer with a separate timing control, is used to generate the data used to form the eye diagram. Using auxiliary slicers to generate an eye diagram requires equalization of the signal prior to slicing or sampling. To be non-destructive, such a technique would require a second ADC, a replica of all the digital signal processor (DSP) equalization circuitry and an independent timing control, thus resulting in a significant increase in hardware cost. A need continues to exist for an improved method of forming an eye diagram.

SUMMARY

A method of constructing a waveform from N sampled data captured at N successive points in time, in accordance with one embodiment of the present invention, includes, in part, applying the N sampled data, K data at a time, to each of M delayed replicas of a filter that includes K taps so as to generate N×M interpolated data. The waveform is then constructed using the N sampled data and the N×M interpolated data. It is understood that K, N and M are integers and K is smaller than N.

In one embodiment, the waveform is an eye-diagram characterizing the quality of a communications link receiver. In one embodiment, the waveform defines a pulse response received by a communication link. In one embodiment, the filter has a finite length and is non-recursive. In one embodiment, the filter has a finite length and is recursive.

In one embodiment, the N data points are sampled at periodic time intervals. In one embodiment, the delay between $i^{th}$ and $(i+1)^{th}$ delayed replicas of the filter is the same as the delay between $(i+1)^{th}$ and $(i+2)^{th}$ delayed replicas of the filter. In one embodiment, the method further includes, in part, storing the filter coefficients associated with each of the delayed replicas of the filter in a read-only memory. In one embodiment, the N sampled data are defined by $2^Q$ levels, where Q is an integer equal to or greater than 2. In one embodiment, the method further includes, in part, applying the sampled data and a subset of the N×M interpolated data to the filter to generate a second set of interpolated data.

A system configured to construct a waveform from N sampled data captured at N successive points in time, includes, in part, a data collection unit, a filter having K taps, a control logic and a waveform construction logic. The data collection unit is adapted to collect the N sampled data. The control logic is configured to cause the filter to receive the N sampled data, K data at a time, to each of M delayed replicas of the filter so as to generate N×M interpolated data. The waveform construction logic is configured to construct the waveform using the N sampled data and the N×M interpolated data. It is understood that K, N and M are integers and K is smaller than N.

In one embodiment, the waveform is an eye-diagram characterizing the quality of a communications link receiver. In one embodiment, the waveform defines a pulse response received by a communication link. In one embodiment, the filter has a finite length and is non-recursive. In one embodiment, the filter has a finite length and is recursive. In one embodiment, the delay between $i^{th}$ and $(i+1)^{th}$ delayed replicas of the filter is the same as the delay between $(i+1)^{th}$ and $(i+2)^{th}$ delayed replicas of the filter.

In one embodiment, the system further includes, in part, a read-only memory adapted to store the filter coefficients associated with each of the delayed replicas of the filter. In one embodiment, the N sampled data are defined by $2^Q$ levels, where Q is an integer equal to or greater than 2. In one embodiment, the filter is formed in a silicon substrate.

A computer readable storage medium, in accordance with one embodiment of the present invention, includes, in part, instructions which when executed by a processor cause the processor to apply N sampled data, K data at a time, to each of M delayed replicas of a filter that includes K taps so as to generate N×M interpolated data. The instructions further cause the processor to construct the waveform using the N sampled data and the N×M interpolated data. It is understood that K, N and M are integers and K is smaller than N.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
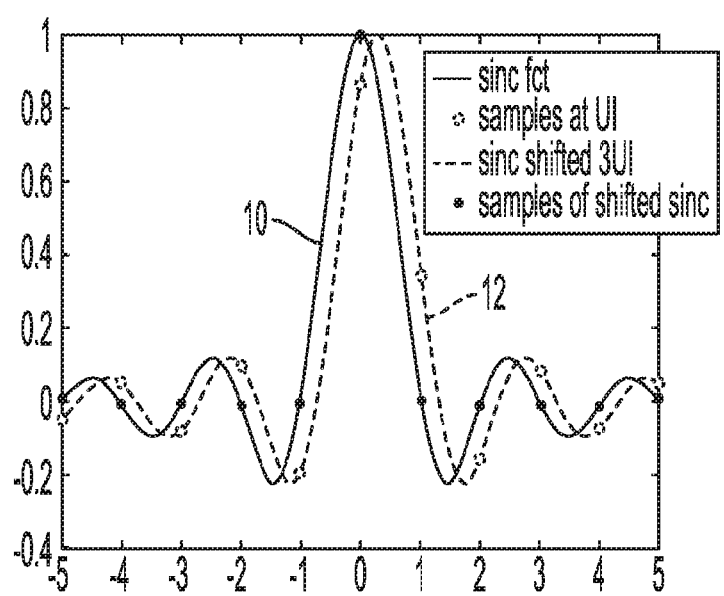
FIG. 1 shows a Sinc function defining the characteristics of a filter used to interpolate data, in accordance with one embodiment of the present disclosure.

A need continues to exist for an improved method of forming an eye diagram. Systems, methods, and circuitry are described for generating an eye diagram in accordance with embodiments of the present disclosure. In one embodiment, rather than capturing samples at many different time points, embodiments of the present disclosure interpolate between data sampled at predefined regular time intervals to "fill in" the data that would nominally require extra circuits to acquire.

In one embodiment, at least one sample is generated per unit interval (UI) to generate a full, fine resolution eye diagram. The data at time points between the UI-spaced samples is generated by passing the per unit UI data through a number of interpolation processes, described further below, to generate the eye diagram. Although the following description of the present disclosure is described with reference to collecting one data sample per UI to generate an eye diagram, it is understood that embodiments of the present disclosure are equally applicable to generating an eye diagram using multiple samples per UI or using different number of samples at different times thus resulting in a non-integer number of samples per UI.

Embodiments of the present disclosure may be used to generate an eye diagram from the data that has or has not been equalized by, for example, a digital signal processor (DSP). Furthermore, in addition to forming an eye diagram, embodiments of the present disclosure, may be used to assess a communication link quality by determining the communication link's vertical fuzz thickness, horizontal fuzz thickness, crossing jitter and the communication link's many other characteristics.

As described in detail below, embodiments of the present disclosure are adapted to interpolate between data samples collected at regular time intervals by a data sampler of a communications link to generate a data set enabling the creation of an accurate eye diagram. In other words, instead of capturing samples at intermediate time points, embodiments of the present disclosure interpolate between the already captured data samples in order to "fill in" the data that would otherwise require additional circuits. For example, assume that a slicer is adapted to sample data at regular unit time intervals (UI) of $T_1$, $T_1+1*UI$, $T_1+2*UI$ . . . $T_1+N*UI$. To generate an eye diagram, instead of shifting the timing offset of the slicer by, for example ¼UI, to collect data samples at times $T_1+1.25*UI$, $T_1+2.25*UI$ . . . $T_1+(N+0.25)*UI$, embodiments of the present disclosure, interpolate between the samples collected at $T_1$, $T_1+1*UI$, $T_1+2*UI$ . . . $T_1+N*UI$, to provide an accurate estimation of the missing data at $T_1+1.25*UI$, $T_1+2.25*UI$ . . . $T_1+(N+0.25)*UI$. As used herein, the terms interpolation and fractional delay are considered interchangeable.

In one embodiment, data interpolation is performed using a finite length digital filter whose coefficients are stored in a storage medium such as a read-only memory (ROM) that is on-chip.

Assume that the interpolation is performed by shifting the delay of a filter by amount D. The Z-domain delay may be written as a discrete time Fourier transform (DTFT) as:

$$z = e^{-j\omega} \qquad (1)$$

in which $\omega=2\pi fT$, and T represents the sampling interval.

The DTFT of the delay may be written as:

$$H(e^{j\omega}) = e^{-j\omega D} \qquad (2)$$

The inverse DTFT may be computed as shown below:

$$h(n) = \frac{1}{2\pi}\int_{-\pi}^{\pi} H(e^{j\omega})e^{j\omega n}d\omega = \frac{1}{2\pi}\int_{-\pi}^{\pi} e^{-j\omega D}e^{j\omega n}d\omega \qquad (3)$$

Expression (3) may further be written as:

$$h(n) = \frac{\sin[\pi(n-D)]}{\pi(n-D)} = \text{sinc}(n-D) \qquad (4)$$

It is understood that D is a fraction of the UI. In one embodiment, to ensure that h(n) has an infinite length, the coefficients of h(n) are defined by sinc(n−D) when $$n = -\frac{N}{2:N},$$

and are zero elsewhere.

FIG. 1 shows a plot defined by a by sinc(n−D) function characterizing a filter that includes 11 taps. The points identified by a solid circle on plot 10 occur at respective time intervals −5*UI, −4*UI, −3*UI, −2*UI, −UI, 0 UI, 2*UI, 3*UI, 4*UI and 5*UI. If the filter coefficients are selected such that the sinc function is shifted by 0.3*UI time unit, plot 12 is obtained thus causing the points identified by a solid circle to be sampled at respective time intervals −5*UI, −4*UI, −3*UI, −2*UI, −UI, 0 UI, 2*UI, 3*UI, 4*UI and 5*UI.

As is seen from FIG. 1, the sinc(n−D) function has oscillating and decaying tap values in which the side lobes decay slowly. In some embodiments, a relatively long filter is used for interpolation. It is understood that the interval over which the interpolation process is applied need not be limited to 1 UI. A shorter or wider range of any integer multiple of UI, fraction of UI, or an integer multiple in addition to fraction of UI may be used. It is also understood that the range over which the interpolation is performed need not be symmetric nor contain the time point defined by zero.

Assume that the filter has K taps. Assume further that it is desired to have M delay quantization steps per UI. The delay quantization determines the horizontal resolution of the eye diagram. It is understood that the larger the value of M, the larger the number of interpolations will be, in turn, resulting in more and finer details in the eye diagram.

Therefore, for a filter with K taps, and M quantization steps per UI, K*M coefficients are required for a filter defined by h(n) above. To perform a shift by the delay amount D, K samples of h(1+D), h(M+1+D), h(2*M+1+D) . . . are selected as the filter coefficient. By changing the filter taps, a different delay is achieved.

For example, a slicer has generated one thousand data points sampled at regular time intervals that are 1 UI apart. It is desired to determine data at 0.25 UI, 0.5 UI and 0.75 UI by interpolation, as described above in accordance with embodiments of the present disclosure. It is further desired that the selected filter have 13 taps. To achieve this, the filter function is delayed by 0.25 UI to generate the associated filter coefficients for the 13 taps. The filter coefficients associated with the 0.25 UI delay are subsequently applied to 13 data points at a time of the one thousand data points, to generate a first set of filter generated one thousand data points. The first set of filter generated one thousand points are then interpolated to generate the data at 0.25 UI. Next, the filter function is delayed by 0.5 UI to generate another set of filter coefficients that are applied to 13 data points at a time of the one thousand samples to generate a second set of filter generated one thousand data points. The second set of filter generated thousand points are then interpolated to generate the data at 0.5 UI. Next, the filter function is delayed by 0.75 UI to generate another set of filter coefficients that are applied to 13 data points at a time one thousand samples to generate a third set of filter generated one thousand samples points. The third set of filter generated one thousand points are then interpolated to generate the data at 0.75 UI.

Since the filter function and its characteristics are known in advance, the filter coefficients for each desired delay value may also be generated in advance and stored in a memory, such as a ROM. Specifying the delay amount provides the address in which the corresponding filter coefficients are stored. The horizontal resolution of the eye diagram may be changed by selecting the time delays for the interpolation process. The steps between the time delays may be uniform or non-uniform. The data samples may be supplied by an ADC or any other suitable circuitry.

In accordance with one embodiment, the eye diagram may be generated as described below. First, a set of data samples is collected and stored into a storage array, such as a static random access memory (SRAM) which may be on-chip or off-chip. Next, a desired time for the interpolation process is selected. The captured data is then passed through the interpolation process to generate a set of time shifted interpolated data samples representative of the signal at the desired time. Thereafter, a histogram of the data samples from the data samples so generated is stored in a matrix column corresponding to the desired time. The histogram is the distribution of voltage samples at the desired point in time. The voltage samples are stored in the matrix rows. The process described above is then repeated until the data for the desired time points covering the selected time intervals are generated. The data in the matrix column and rows, which are respectively indicative of the time and voltages are then used to generate the eye diagram. It is understood that embodiments of the present disclosure equally apply to non-uniform sampling to provide more details in certain regions of the eye diagram.

In one embodiment, the interpolation process may be performed by a class of filters commonly referred to as Fractional Delay Filters (FDFs). Such filters may be realized in many forms such as a Finite Impulse Response (FIR), Farrow structure, or polyphase representation. It is understood that embodiments of the present disclosure are not limited to any particular type of filter.

In one embodiment, an FDF is used to generate an oversampled copy, i.e., M samples per UI, of an interpolating filter function characterized by a truncated sinc or a raised cosine filter function that spans N*UI range. The oversampling of the filter defines the interpolation step size. The interpolation includes selecting K M-spaced taps to filter the data. For example a first interpolation filter might include taps 1, M+1, 2*M+1, . . . of the filter. To interpolate at 1/M*UI time intervals, the captured data is filtered with a filter that includes taps 2, M+2, 2*M+2, . . . of the filter. This process is repeated until the desired interval is covered.

In accordance with another embodiment, to sweep the eye with an FDF, a single interpolation filter that interpolates the desired time step may be used. In such embodiments, the first set of interpolated data is generated by filtering the captured data. The second set of interpolated data are generated by filtering the first set of interpolated data with the same filter and using the same filter coefficients. The second set of interpolated data is thus delayed one time step from the first set of interpolated data, or two time steps from the originally captured data. This process may be repeated until the entire time interval for the interpolation is covered.

In another embodiment, the interpolation process may be achieved algebraically, such as by using Lagrange interpolation or spline interpolation. For example, a polynomial function may be used to perform the interpolation. As the coefficients of the polynomial change the interpolation point changes. It is understood that any interpolation technique may be used to form an eye diagram, in accordance with embodiments of the present disclosure.

Figure 2:
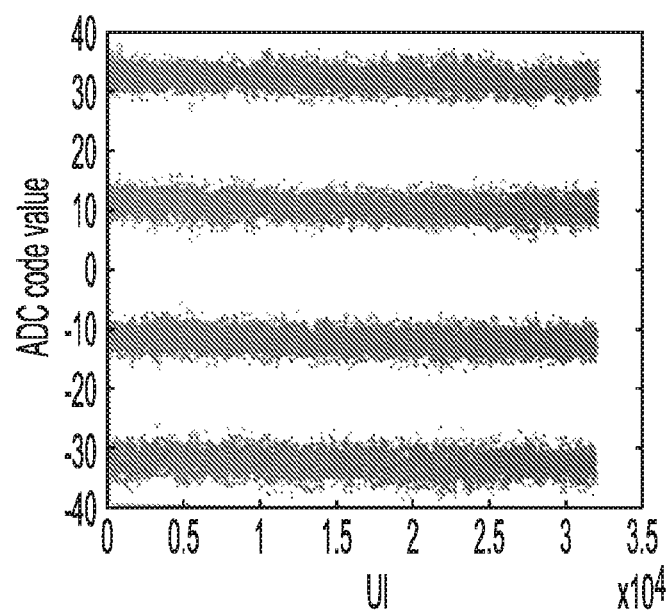
FIG. 2 shows exemplary data captured by a slicer at the receiver of a communication link.
Figure 3:
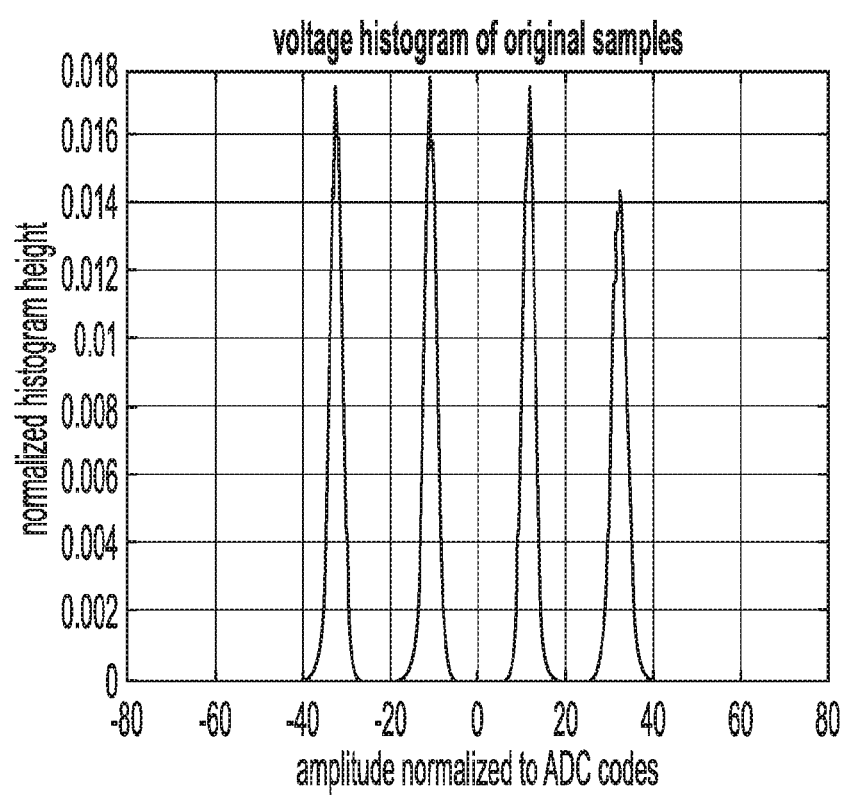
FIG. 3 is a histogram of the data shown in FIG. 2.
Figure 4:
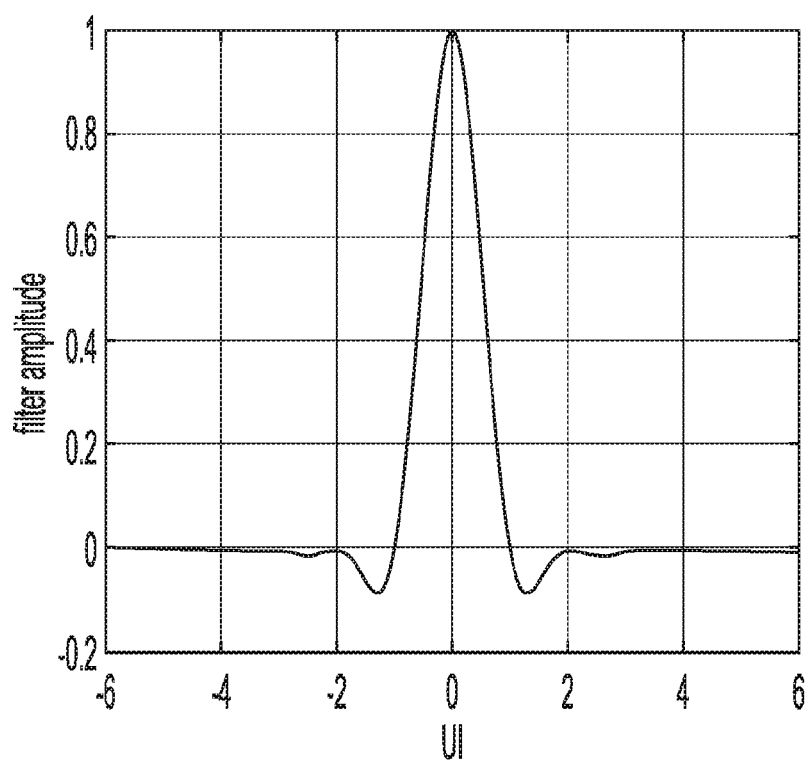
FIG. 4 shows the response characteristics of an exemplary filter that may be used to generate timing offsets and interpolate data, in accordance with one embodiment of the present disclosure.

FIG. 2 shows 4 level Pulse Amplitude Modulation (PAM4) data captured by a slicer and quantized by an exemplary multi-bit ADC. The 4 desired signal levels are visible at nearly ±10 and ±30 millivolts. FIG. 3 is a histogram of the data shown in FIG. 2. FIG. 4 shows a response characteristics of an exemplary filter that may be used to generate timing offsets (delays) with a granularity of 1/64 of a UI—i.e., the filter has 64 taps per UI and spans 12 UI. The filter characteristics is defined by a raised cosine function with a rolloff of $$\frac{\sqrt{2}}{2}.$$

Figure 5:
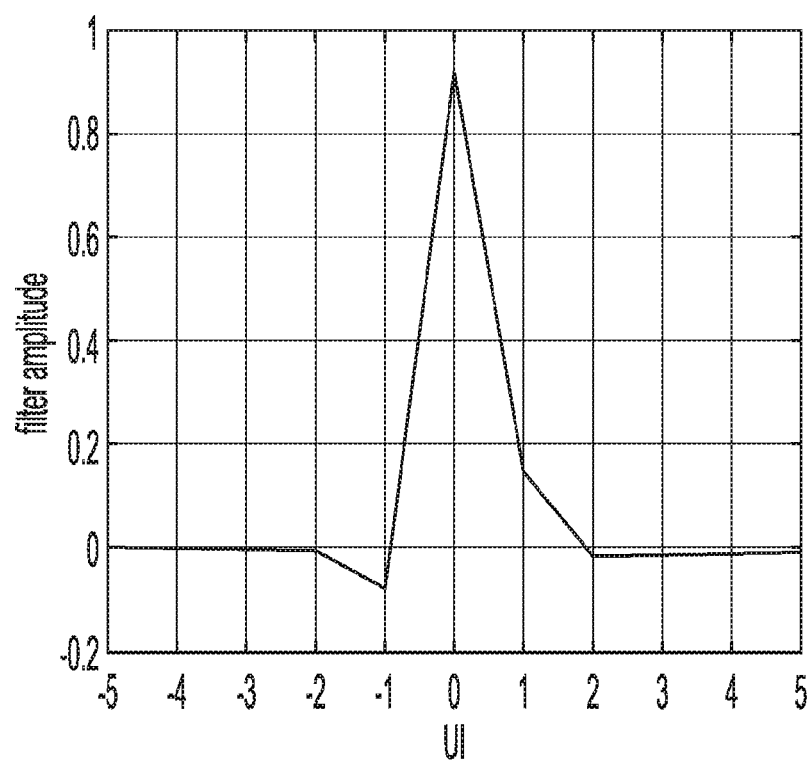
FIG. 5 shows data interpolated by the filter of FIG. 4, in accordance with one embodiment of the present disclosure.
Figure 6:
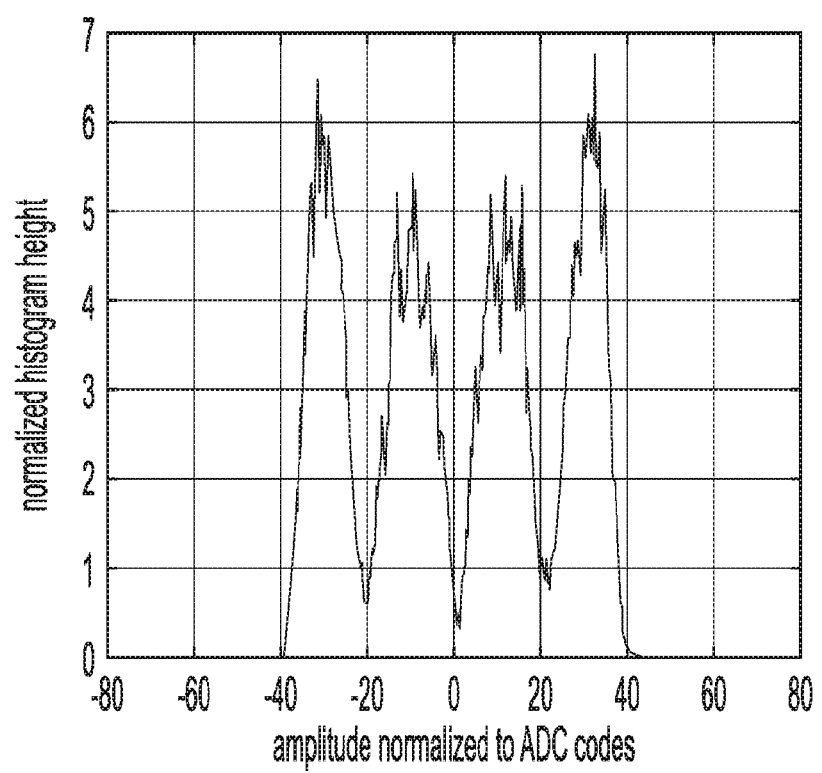
FIG. 6 is a histogram of the interpolated data shown in FIG. 5, in accordance with one embodiment of the present disclosure.
Figure 7:
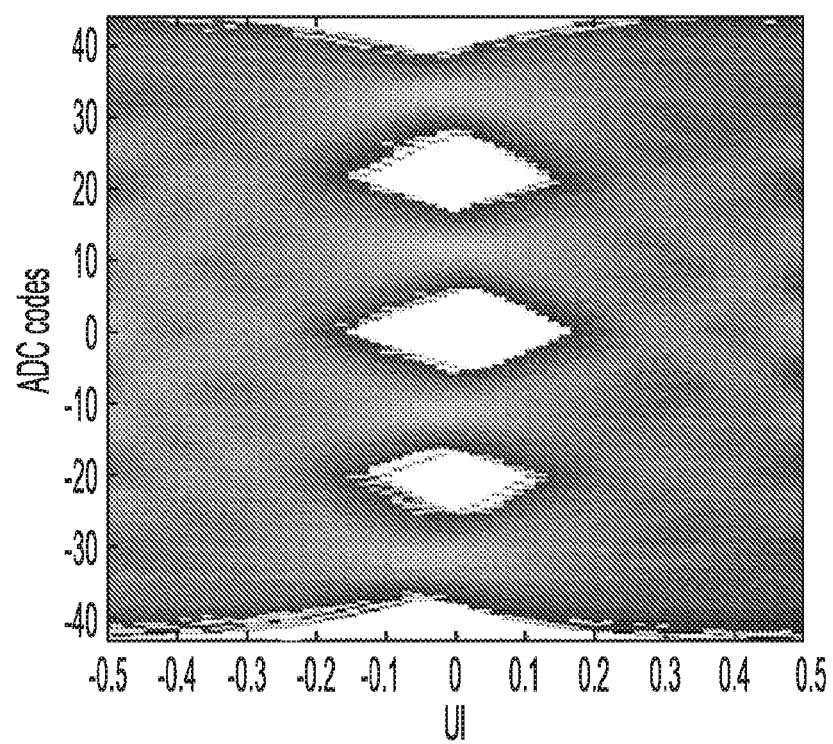
FIG. 7 is an exemplary eye diagram generated from the data shown in FIG. 2, in accordance with one embodiment of the present disclosure.

FIG. 5 shows the subset of filter coefficients of FIG. 4 that would be used for a delay defined by $20/64^{th}$ of the way through the UI. The shift corresponds to $12/64^{th}$ of the way through the UI if the $32/64^{th}$ is defined as the zero time point. FIG. 6 is a histogram of interpolated data samples at a time offset of $-12/64^{th}$ from the center. FIG. 7 is an example of an eye diagram created from the data shown in FIG. 2 and using the interpolation process across 1 UI as described above and shown further with reference to FIGS. 2-6.

As described above, in some embodiments a raised cosine filter function is used for interpolation as defined below:

$$h(t) = \begin{cases} \frac{\pi}{4T}\mathrm{sinc}\left(\frac{1}{2\beta}\right), & t = \frac{\pm T}{2\beta} \\ \frac{1}{T}\mathrm{sinc}\left(\frac{t}{T}\right)\frac{\cos\left(\frac{\pi\beta t}{T}\right)}{1-\left(\frac{2\beta t}{T}\right)^2}, & \text{otherwise} \end{cases}$$

Figure 8:
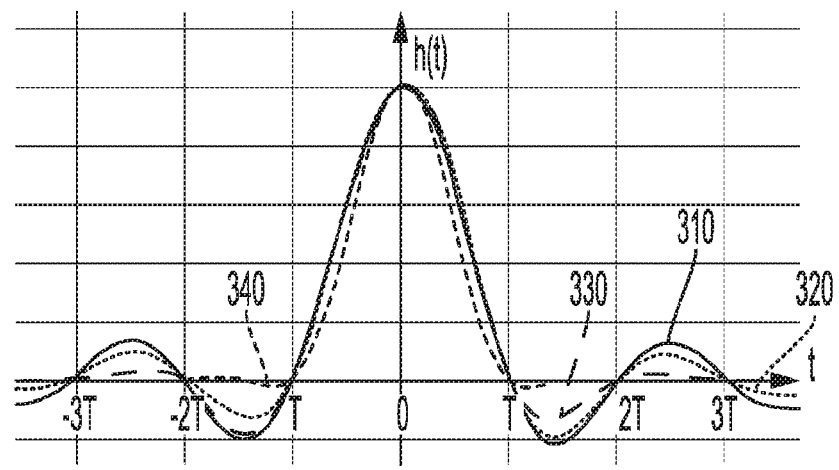
FIG. 8 shows raised cosine functions with different beta parameters used for interpolating data, in accordance with one embodiment of the present disclosure.

As shown in FIG. 4, the raised cosine filter includes a rolloff parameter β that determines how fast the sidelobes die off. Plots 310, 320, 330 and 340 of FIG. 8 respectively show the raised cosine function defined above for parameter values of 0, 0.25, 0.5 and 1. In one example, a rolloff parameter β value of 0.8 is used.

Figure 9:
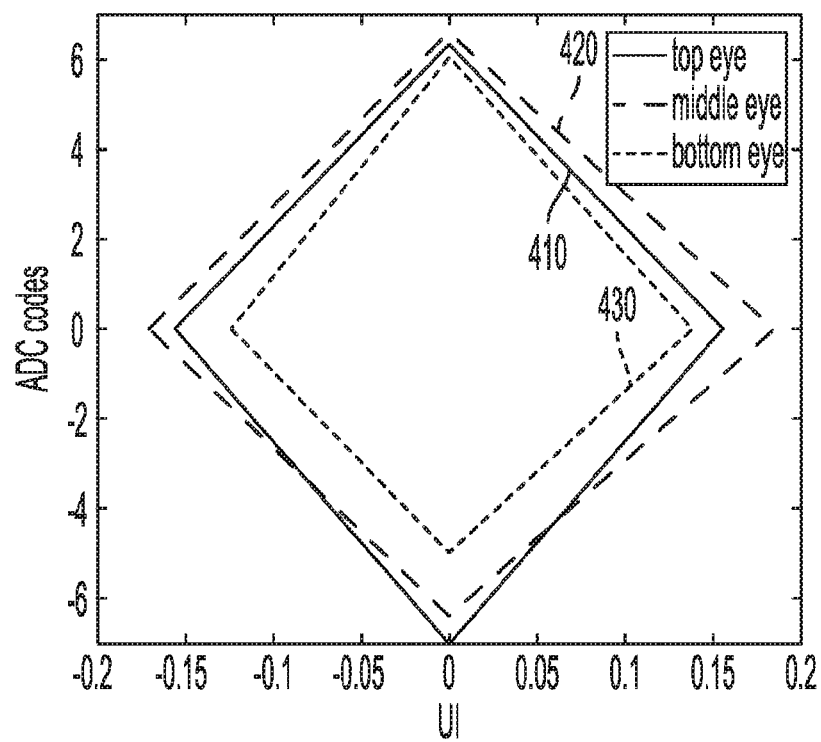
FIG. 9 shows the contours of the areas near the top, middle and bottom of the eye diagram of FIG. 7, in accordance with one embodiment of the present disclosure.
Figure 10:
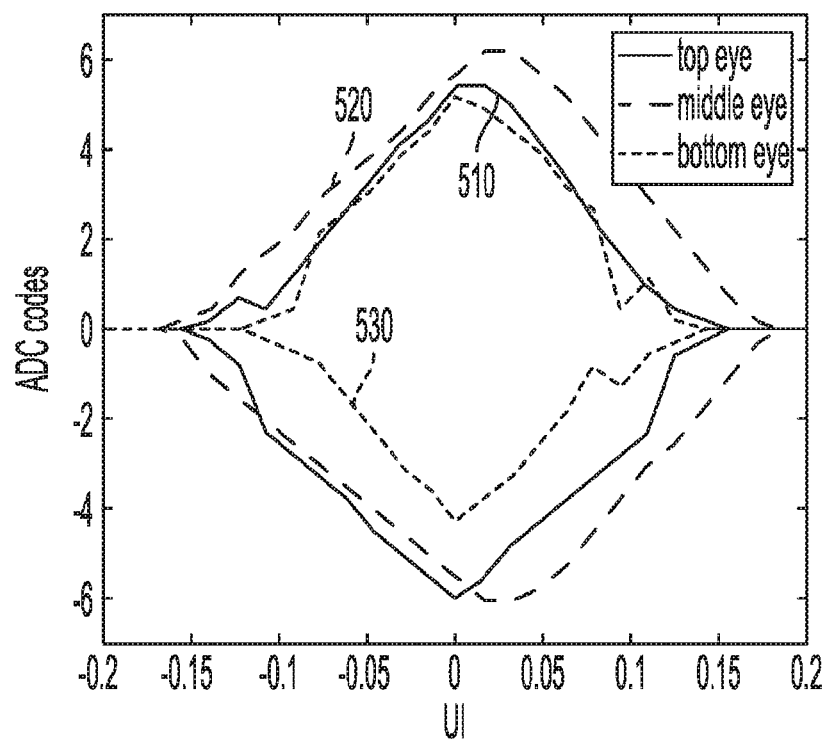
FIG. 10 shows more detailed views of the contours of the areas near the top, middle and bottom of the eye diagram of FIG. 7, in accordance with one embodiment of the present disclosure.

In addition to generating an eye diagram, embodiments of the present disclosure may be used to generate measurements of the eye height and eye width from the matrix in which eye diagram data is stored. Diamond plots 410, 420 and 430 of FIG. 9 respectively show the contours of the areas near the top, middle and bottom of the eye diagram shown in FIG. 7 at a 97% confidence level and bit error rate of 1e−4.028. The confidence level and the bit error rate are a function of the number of points that were captured to generate the eye diagram. In some embodiments, the eye height may be computed at each interpolation point along the x-axis to create a more detailed view of the inner eye contour. Plots 510, 520 and 530 of FIG. 10 respectively show the contours of the areas near the top, middle and bottom of the eye diagram shown in FIG. 7 at a 97% confidence level and bit error rate of 1e−4.028 as when the eye height is computed at each interpolation point along the x-axis. The confidence level and the bit error rate are a function of the number of points that were captured to generate the eye diagram.

Figure 11A:
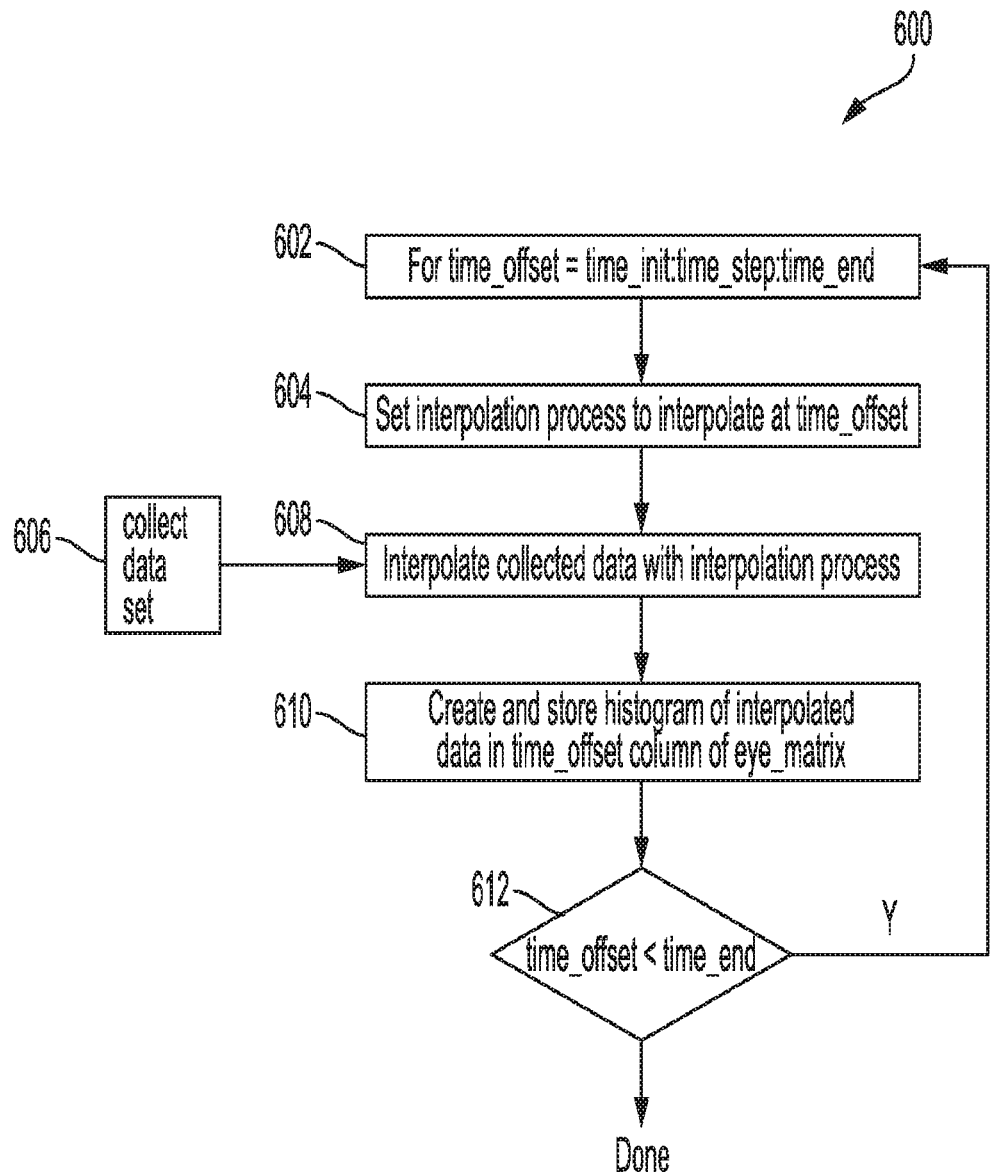
FIG. 11A is a flowchart for generating an eye diagram, in accordance with one embodiment of the present disclosure.

FIG. 11A is a flowchart 600 for generating an eye diagram, in accordance with one embodiment of the present disclosure. At 602, a time offset (time_offset) defined by an initial time (time_init), a time step size (time-step), and an end time (time_end) is defined. At 604, the interpolation process is selected. At 608, the interpolation process is carried out using the data set collected at 606 and the time offset defined at 602.

At 610, a histogram of the interpolated data is generated and stored in a memory corresponding to a column of a matrix (eye_matrix) defined by the time-offset. At 612, the time offset is compared to the end time. If the time offset is less than the end time, the process moves to 602 to increment the time step and repeat the interpolation. If the time offset is not less than the end time, the process is terminated.

Figure 11B:
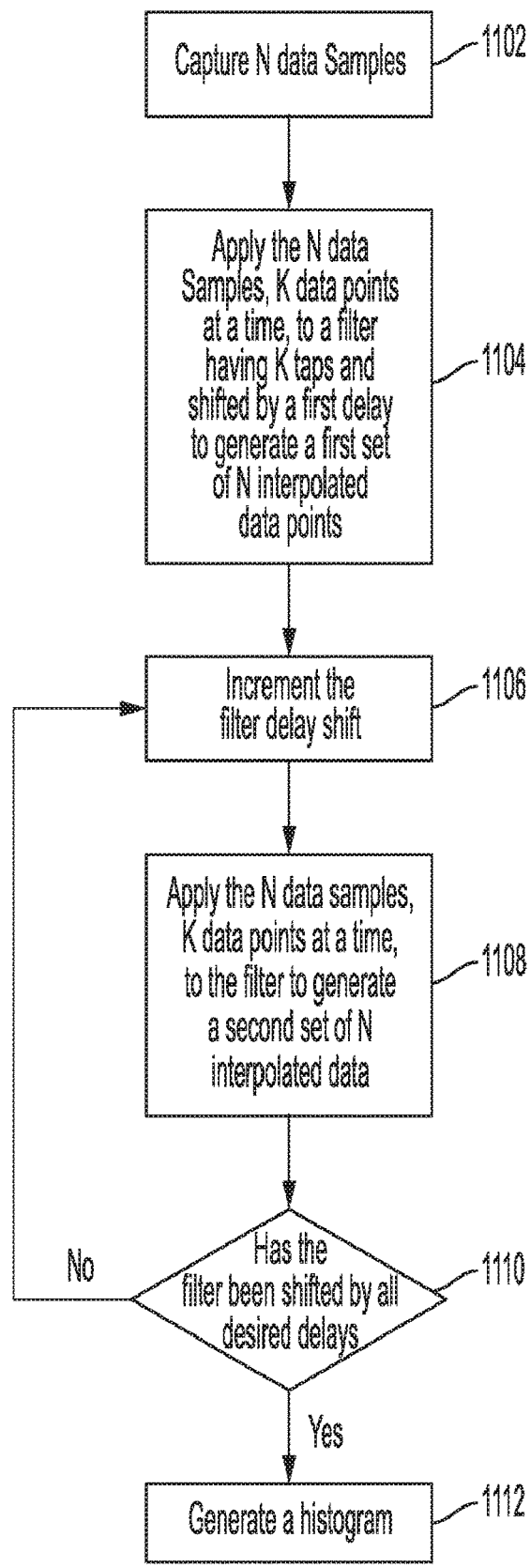
FIG. 11B is a flowchart showing more details of a few of the steps of the flowchart of FIG. 11A, in accordance with one embodiment of the present disclosure.

FIG. 11B is a more detailed view of the flowchart shown in FIG. 11A. At 1102 N data points sampled at different times are captured. The times at which the samples are captured may or may not occur at the end of regular time intervals. At 1104, the N data samples are then applied, K data points at a time, to a filter with K taps and shifted by a first delay to generate a first set of N interpolated data. Next at 1106, the filter delay shift is incremented. At 1108, the N data sample are applied, K data points at a time, to the delay-shifted filter to generate another set of N interpolated data. If at 1110, a determination is made that the filter has been shifted by all desired delays, the sets of N interpolated data are used together with the sampled data to generate an eye diagram. If at 1110, a determination is made that the filter has not been shifted by all desired delays, the process returns to 1106 and repeated.

Figure 11C:
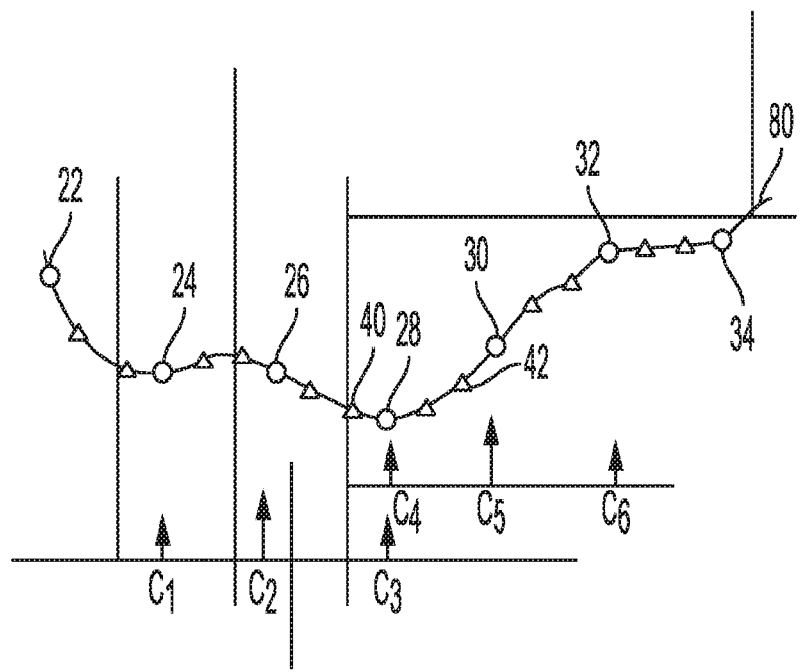
FIG. 11C shows data interpolated using a filter, in accordance with one embodiment of the present invention.

FIG. 11C shows 7 exemplary data samples 22, 24, 26, 28, 30, 32, 34, identified using circles, that have been captured from analog waveform 80. In accordance with one exemplary embodiment, a filter having 3 taps is used to generate the interpolated data identified using triangles. Arrows $C_1$, $C_2$, $C_3$ represent the filter coefficients applied to data samples 22, 24, 26 to generate the interpolated data 40. The arrow lengths represent the relative weighs of the filter coefficients. Similarly, arrows $C_4$, $C_5$, $C_6$ represent the filter coefficients applied to data samples 28, 30, 32 to generate the interpolated data 42. It is understood that the remaining interpolated data are generated in the same manner.

Figure 12:
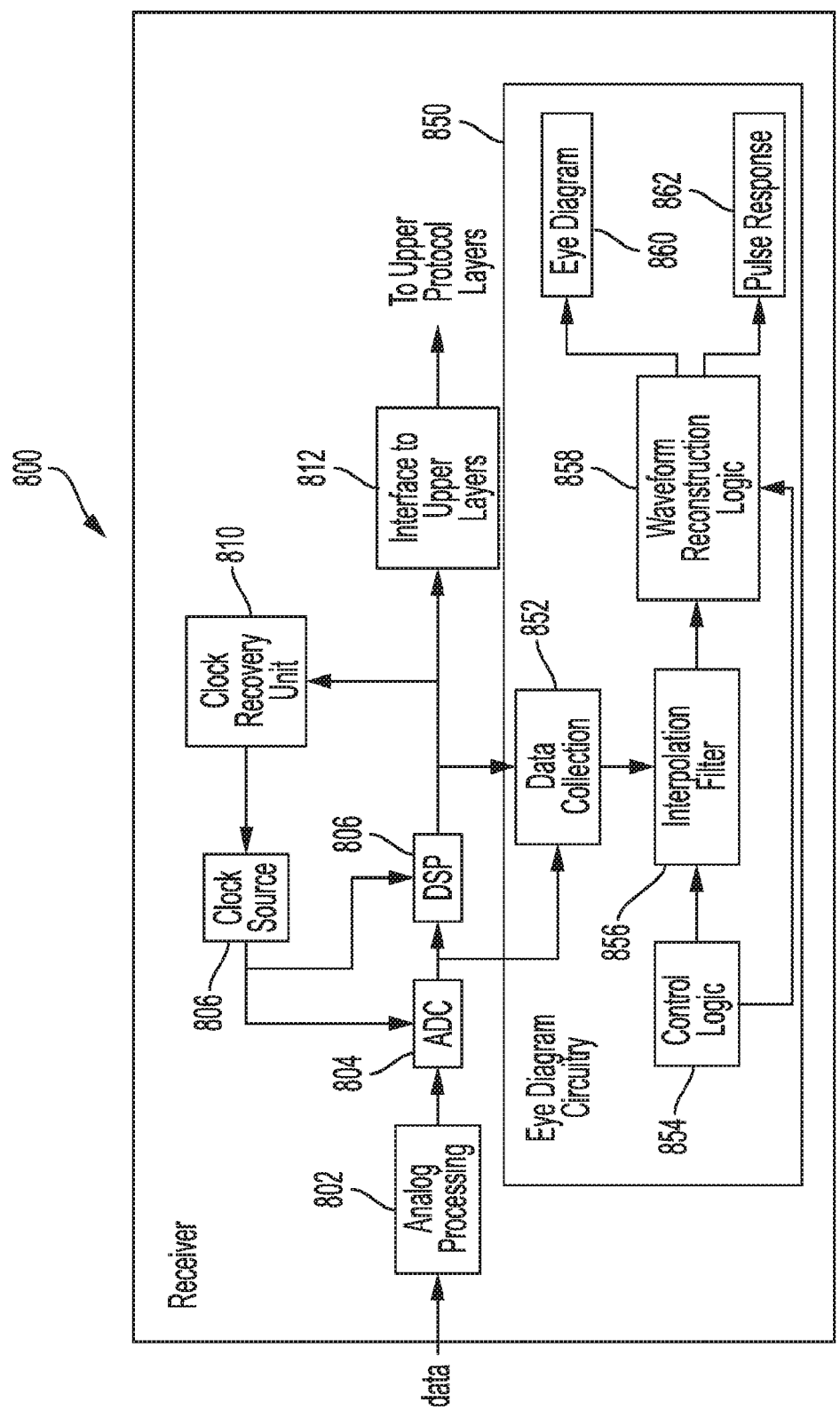
FIG. 12 is a simplified high-level block diagram of a receiver configured to provide interpolated data for waveform reconstruction, in accordance with one embodiment of the present invention.
Figure 13:
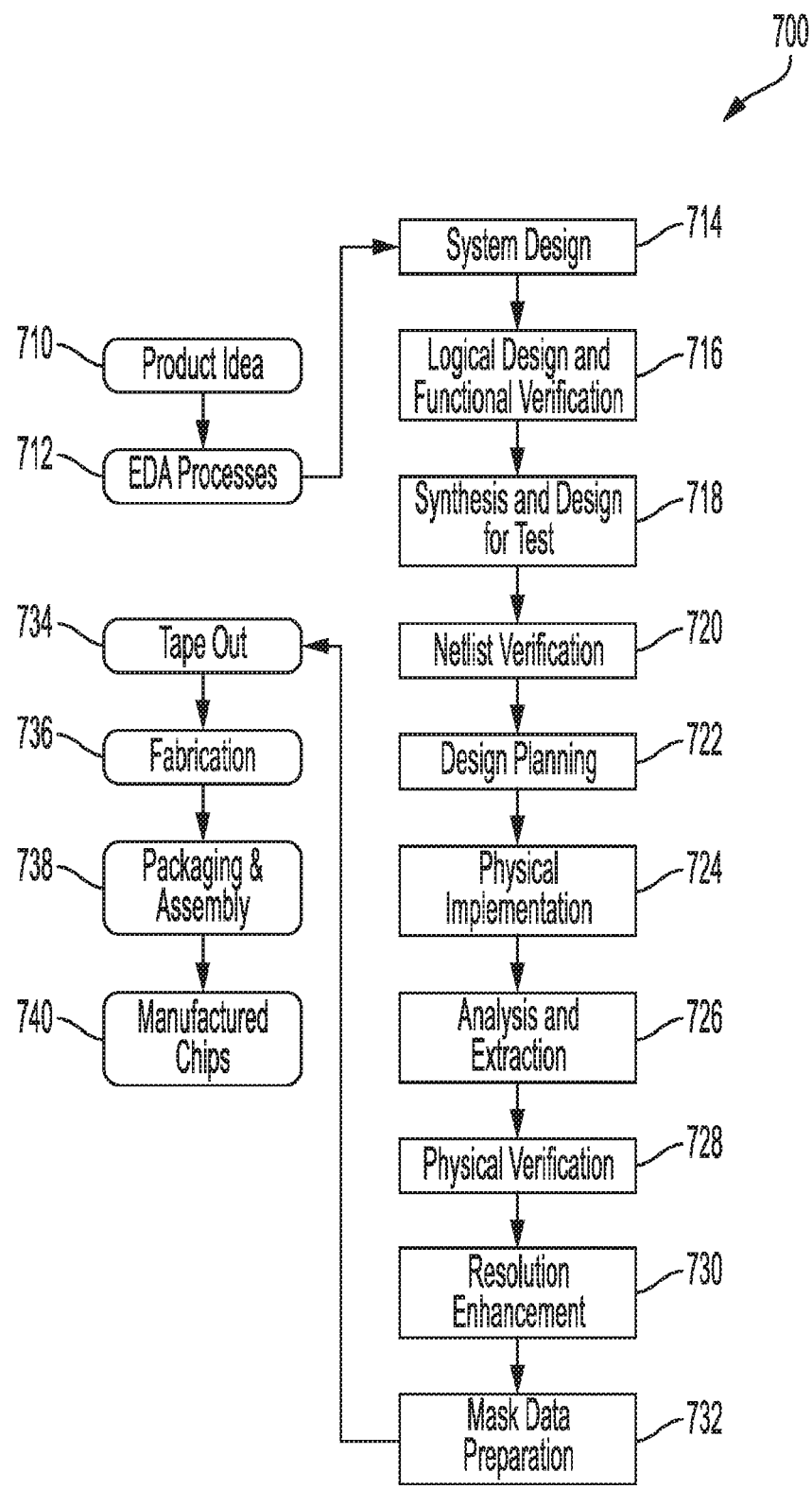
FIG. 13 depicts a flowchart of various processes used during the design and manufacture of an integrated circuit in accordance with some embodiments of the present disclosure.

FIG. 12 is a simplified high-level block diagram of a receiver 800 configured to provide interpolated data for use in generating, for example, an eye diagram, a pulse response, and the like, in accordance with one embodiment of the present disclosure. Data received by the receiver is delivered to analog processing unit 802 which is adapted to provide impedance matching, signal equalization, and variable gain amplification, among other functions, or pass the received signal to analog-to-digital converter (ADC) 804. Analog-to-digital converter (ADC) 804 is adapted to convert the analog output signal of analog processing unit 802 to a digital signal using a clock signal supplied by clock source 806.

Digital signal processor (DSP) 806 is adapted to perform one or more of digital equalization, FeedForward equalization, and decision feedback equalization, among other functions, on the data samples supplied by ADC 804 using the clock signal supplied by clock source 806. Clock recovery unit 810 is adapted to recover the clock signal from the data supplied by DSP 806 and supply the recovered clock signal to clock source 806 for synchronization. The data supplied by DSP 806 may be sent to upper layers of the communication link via interface 812.

The data sampled by ADC 804 is also delivered to data collection unit 852 of waveform reconstruction unit 850. Data collection unit 852 may be a static random access memory (SRAM) or any other data storage medium. Control logic 854 is adapted to select the filter coefficient associated with a given time offset and cause filter 856 to filter through the data stored in data collection unit 852 using the selected filter coefficients to generate interpolated data. For each time offset, waveform reconstruction logic 858 is adapted to generate a histogram from the interpolated data, when instructed by control logic 803, to create an eye diagram 860. Waveform reconstruction logic 858 is adapted to generate a pulse response from the interpolated data for each time offset when so instructed by control logic 803.

In one embodiment, in which the interpolation is performed by a filter having a response characteristics h(n) that is K*M taps long, to generate an eye diagram, an initial timing offset D is first defined. The subset of filter coefficients can generate K sub-samples by time shifting as described above. Accordingly, D has a range defined by 0<=D<M. The data is then filtered with one of the M interpolation filters, each of which includes K sample samples at h(1+D), h(2+D), h(3+D), . . . h(K+D). Next, a probability density function is generated for the eye diagram at timing offset D. Thereafter, D is incrementing by one time step and the process is repeated.

In some embodiments, the interpolation may be used to form a densely-sampled pulse response for the channel either before or after a digital signal processing (DSP) operation is applied in the receiver. The pulse response may then be plotted and/or analyzed to determine channel quality and equalization effectiveness. The pulse response may be generated by using a filter that has tap spacing equal to the interpolation spacing and adapting the filter using a technique referred to as system identification. To achieve this, the transmitted data symbols (ideal symbols) are first recovered from the captured data. Then the filter is adapted so that when the ideal samples are applied to the adapted filter, the output of the filter matches the captured data. Accordingly, the adapted filter becomes a model of the channel from the transmitter to the receiver. Such a filter need not have a set length and is not limited by the manner in which the interpolation is performed.

In accordance with another embodiment, pulse response is obtained from correlations between what is considered to be a present time sample and earlier or later samples. Without interpolation the granularity of the pulse response is limited to 1 point per UI. With the use of interpolation, as described herein, the granularity of the pulse response can be improved by a factor of M where M is the oversampling rate of the interpolation filter. A finer granularity pulse response may equivalently be obtained by first obtaining a 1 point per UI pulse response and convolving that response with the full (K*M) interpolation filter.

In one embodiment, the pulse response, generated as described above, is used to generate a noiseless eye diagram so as to account only for inter-symbol interference. This may obtained by passing ideal data symbols through one of the high resolution pulse responses generated as described above. Using the recovered symbols mentioned above, the impact of jitter and noise on the received signal quality may be determined. In one embodiment, this may be achieved by comparing (e.g., overlaying, differencing, etc.) the reconstructed analog waveform generated from the data capture with the analog waveform constructed from the pulse response and recovered symbols, as described above.

In one embodiment, the data captures may be masked to retrieve specific bit patterns (e.g., a lone bit, or a Nyquist pattern). The masking may be done on-die, where only the desired bits are collected. The masking may also be performed by sifting through captured data and using only the desired bits to create the histograms.

Figure 14:
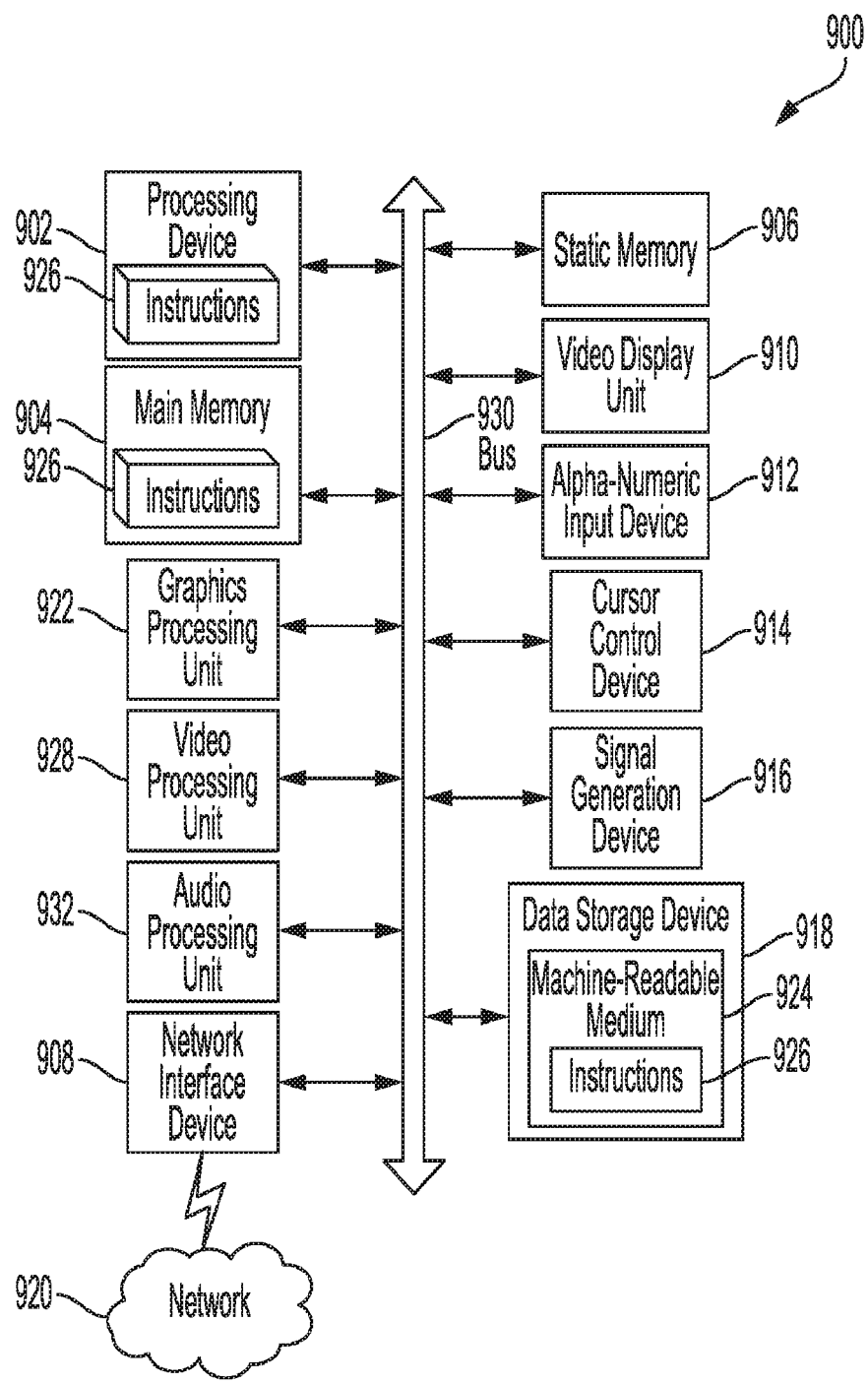
FIG. 14 depicts an abstract diagram of an example computer system in which embodiments of the present disclosure may operate.

FIG. 14 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 14. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 14) may be used to store the programs and data structures that are used by some or all of the EDA products described herein, and products used for development of cells for the library and for physical and logical design that use the library.

FIG. 14 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of constructing a waveform from N sampled data captured at N successive points in time, the method comprising:
    applying K data at a time of the N sampled data to each of M delayed replicas of a filter comprising K taps thereby to generate N×M interpolated data, wherein values of the K taps associated with an $i^{th}$ delayed replica of the filter are determined by shifting a function characterizing the filter by a delay between the $i^{th}$ delayed replica of the filter and the $(i-1)^{th}$ delayed replica of the filter, wherein i is an integer varying from 1 to M; and
    constructing the waveform using the N sampled data and the N×M interpolated data, wherein K, N and M are integers and wherein K is smaller than N.

2. The method of claim 1 wherein the waveform is an eye-diagram characterizing a quality of a communications link receiver.

3. The method of claim 1 wherein the waveform defines a pulse response received by a communication link.

4. The method of claim 1 wherein the filter is of a finite length and is non-recursive.

5. The method of claim 1 wherein the filter is of a finite length and is recursive.

6. The method of claim 1 wherein the N data points are sampled at periodic time intervals.

7. The method of claim 1 wherein a delay between $i^{th}$ and $(i+1)^{th}$ delayed replicas of the filter is a same as a delay between $(i+1)^{th}$ and $(1+2)^{th}$ delayed replicas of the filter.

8. The method of claim 1 further comprising:
    storing the filter coefficients associated with each of the delayed replicas of the filter in a read-only memory.

9. The method of claim 1 wherein the N sampled data are defined by $2^Q$ levels, wherein Q is an integer equal to or greater than 2.

10. The method of claim 1 further comprising:
    applying the sampled data and a subset of the N×M interpolated data to the filter to generate a second set of interpolated data.

11. A system configured to construct a waveform from N sampled data captured at N successive points in time, the system comprising:
    a data collection unit adapted to collect the N sampled data;
    a filter comprising K taps;
    a control logic configured to cause the filter to receive K data points at a time of the N sampled data to each of M delayed replicas of the filter thereby to generate N×M interpolated data, wherein values of the K taps associated with an $i^{th}$ delayed replica of the filter are determined by shifting a function characterizing the filter by a delay between the $i^{th}$ delayed replica of the filter and the $(i-1)^{th}$ delayed replica of the filter, wherein i is an integer varying from 1 to M; and
    a waveform construction logic configured to construct the waveform using the N sampled data and the N×M interpolated data, wherein K, N and M are integers and wherein K is smaller than N.

12. The system of claim 11 wherein the waveform is an eye-diagram characterizing a quality of a communications link receiver.

13. The system of claim 11 wherein the waveform defines a pulse response received by a communication link.

14. The system of claim 11 wherein the filter is of a finite length and is non-recursive.

15. The system of claim 11 wherein the filter is of a finite length and is recursive.

16. The system of claim 11 wherein a delay between $i^{th}$ and $(i+1)^{th}$ delayed replicas of the filter is a same as a delay between $(i+1)^{th}$ and $(i+2)^{th}$ delayed replicas of the filter.

17. The system of claim 11 further comprising:
    a read-only memory adapted to store the filter coefficients associated with each of the delayed replicas of the filter.

18. The system of claim 11 wherein the N sampled data are defined by $2^Q$ levels, wherein Q is an integer equal to or greater than 2.

19. The system of claim 11 wherein the filter is formed in a silicon substrate.

20. A non-transitory computer readable storage medium comprising stored instructions, the instructions when executed by a processor, cause the processor to:

apply K data at a time of the N sampled data to each of M delayed replicas of a filter comprising K taps thereby to generate N×M interpolated data, wherein values of the K taps associated with an $i^{th}$ delayed replica of the filter are determined by shifting a function characterizing the filter by a delay between the $i^{th}$ delayed replica of the filter and the $(i-1)^{th}$ delayed replica of the filter, wherein i is an integer varying from 1 to M; and construct the waveform using the N sampled data and the N×M interpolated data, wherein K, N and M are integers and wherein K is smaller than N.

* * * * *